(12) United States Patent
Toda et al.

(10) Patent No.: US 12,283,489 B2
(45) Date of Patent: Apr. 22, 2025

(54) ETCHING METHOD AND ETCHING APPARATUS

(71) Applicant: Tokyo Electron Limited, Tokyo (JP)

(72) Inventors: Satoshi Toda, Nirasaki (JP); Naoki Shindo, Nirasaki (JP); Mitsuhiro Tachibana, Nirasaki (JP); Haruna Suzuki, Nirasaki (JP); Gen You, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 331 days.

(21) Appl. No.: 17/756,979

(22) PCT Filed: Oct. 28, 2020

(86) PCT No.: PCT/JP2020/040468
§ 371 (c)(1),
(2) Date: Jun. 7, 2022

(87) PCT Pub. No.: WO2021/117368
PCT Pub. Date: Jun. 17, 2021

(65) Prior Publication Data
US 2023/0014819 A1    Jan. 19, 2023

(30) Foreign Application Priority Data

Dec. 9, 2019   (JP) .................... 2019-222355

(51) Int. Cl.
| H01L 21/3213 | (2006.01) |
| C23F 1/00 | (2006.01) |
| C23F 1/02 | (2006.01) |
| C23F 1/12 | (2006.01) |
| C23F 1/44 | (2006.01) |
| H01L 21/306 | (2006.01) |
| H01L 21/67 | (2006.01) |

(52) U.S. Cl.
CPC .......... *H01L 21/32135* (2013.01); *C23F 1/00* (2013.01); *C23F 1/02* (2013.01); *C23F 1/12* (2013.01); *C23F 1/44* (2013.01); *H01L 21/30604* (2013.01); *H01L 21/67069* (2013.01)

(58) Field of Classification Search
None
See application file for complete search history.

(56) References Cited

U.S. PATENT DOCUMENTS

| 8,658,511 | B1 | 2/2014 | Fulgenico et al. |
| 9,837,286 | B2 * | 12/2017 | Yang ................ H01L 21/32136 |
| 2015/0050807 | A1 | 2/2015 | Wu et al. |
| 2018/0327913 | A1 * | 11/2018 | Lansalot-Matras ....... C23C 8/80 |

FOREIGN PATENT DOCUMENTS

| JP | H03-093223 A | 4/1991 |
| JP | 2007-250570 A | 9/2007 |
| JP | 2019-502253 A | 1/2019 |
| TW | 201718942 A | 6/2017 |
| WO | 2011068959 A1 | 6/2011 |

* cited by examiner

*Primary Examiner* — Jiong-Ping Lu
(74) *Attorney, Agent, or Firm* — Armstrong Teasdale LLP

(57) ABSTRACT

An etching method includes: providing, within a chamber, a substrate that includes at least a silicon-containing material and a molybdenum film or a tungsten film which is in an exposed state, and selectively etching the molybdenum film or the tungsten film relative to the silicon-containing material by supplying, into the chamber, an oxidation gas and a hexafluoride gas as an etching gas.

23 Claims, 13 Drawing Sheets

ETCHING METHOD AND ETCHING APPARATUS

CROSS-REFERENCE TO RELATED APPLICATIONS

The present application is a U.S. National Stage Entry of International Patent Application No. PCT/JP2020/040468, filed Oct. 28, 2020, which claims the benefit of priority to Japanese Patent Application No. 2019-222355, filed Dec. 9, 2019, each of which is hereby incorporated herein by reference in its entirety.

TECHNICAL FIELD

The present disclosure relates to an etching method and an etching apparatus.

BACKGROUND

Conventionally, a tungsten (W) film has been used as a conductor film in a semiconductor storage device. In recent years, a molybdenum (Mo) film has also been used. Plasma etching and wet etching are generally used for etching a conductor film, such as a W film. For example, Patent Document 1 discloses a method of selectively etching a tungsten film relative to a silicon-containing film through plasma etching using a $Cl_2$ gas, an $O_2$ gas, and a $N_2$ gas.

PRIOR ART DOCUMENTS

Patent Documents

Patent Document 1: Japanese Laid-Open Patent Publication No. 2007-250570

The present disclosure provides an etching method and an etching apparatus capable of etching a molybdenum film or a tungsten film relative to a silicon-containing film at a high selectivity.

SUMMARY

An etching method of an aspect of the present disclosure includes providing, within a chamber, a substrate that includes at least a silicon-containing material and a molybdenum film or a tungsten film which is in an exposed state; and selectively etching the molybdenum film or the tungsten film relative to the silicon-containing material by supplying, into the chamber, an oxidation gas and a hexafluoride gas as an etching gas.

According to the present disclosure, an etching method and an etching apparatus capable of etching a molybdenum film or a tungsten film relative to a silicon-containing material at a high selectivity are provided.

DETAILED DESCRIPTION

Hereinafter, embodiments will be described with reference to the accompanying drawings.

[Etching Method]

First Embodiment

Figure 1:
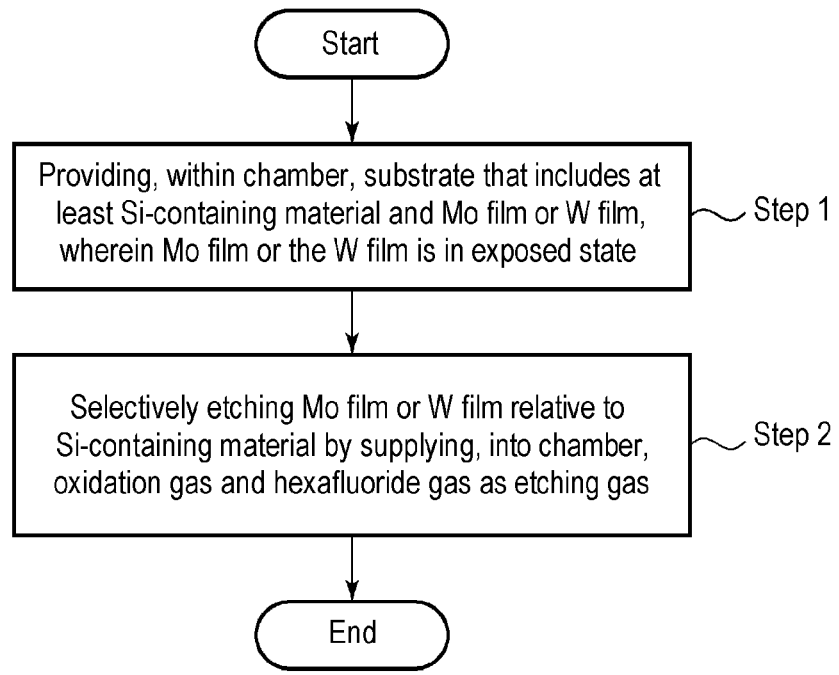
FIG. 1 is a flowchart illustrating an etching method according to a first embodiment.

FIG. 1 is a flowchart illustrating an etching method according to a first embodiment. In the etching method according to the first embodiment, first, a substrate including at least a silicon (Si)-containing material and a molybdenum (Mo) film or a tungsten (W) film which is in an exposed state is provided within a chamber (step 1). Next, the Mo film or the W film is selectively etched relative to the Si-containing material by supplying, into a chamber, an oxidation gas and a hexafluoride gas as an etching gas (step 2).

The substrate used for etching is not particularly limited, but a semiconductor wafer having a semiconductor substrate such as Si is used as an exemplary embodiment.

Examples of the Si-containing material may include Si, silicon oxide ($SiO_2$), and silicon nitride (SiN). These are typically formed as films. That is, the substrate may include at least one of a Si film, a $SiO_2$ film, and a SiN film as the Si-containing material. The Si as the Si-containing material may be the substrate itself.

The Mo film and the W film may be formed through a commonly used film forming technique, and examples thereof may include those formed through CVD, ALD, and PVD.

In addition, the substrate may include a film, other than the Mo film or the W film, and a Si-containing material. For example, at least one of an $Al_2O_3$ film and a TiN film may be included under the Mo film or the W film as a barrier film.

Figure 2:
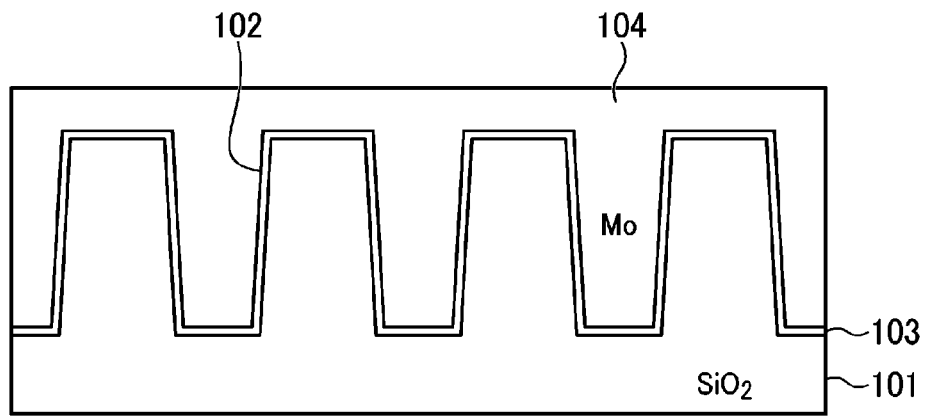
FIG. 2 is a cross-sectional view illustrating an example of a structure of a substrate to which the etching method according to the first embodiment is applied.
Figure 3:
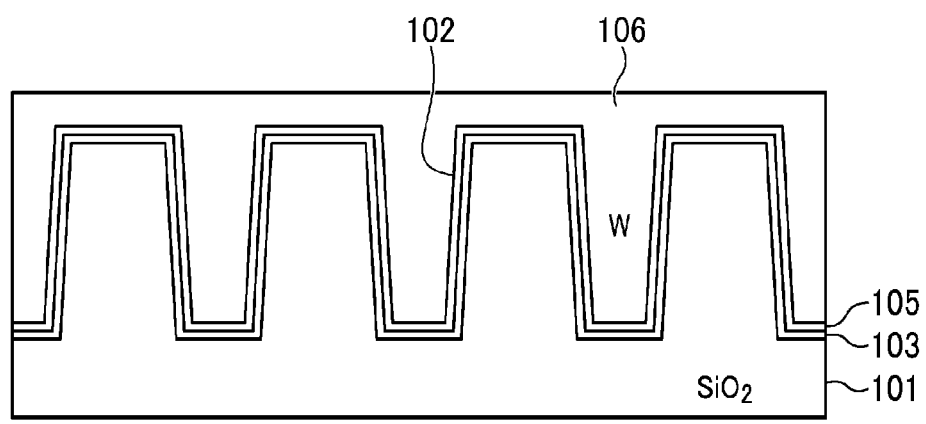
FIG. 3 is a cross-sectional view illustrating another example of the structure of the substrate to which the etching method according to the first embodiment is applied.

The structure of the substrate is not particularly limited as long as it includes a Mo film or a W film and a Si-containing material and the Mo film or the W film is exposed, but examples of the structure of the substrate may include a structure in which, on a Si-containing film having a given pattern formed thereon, a Mo film or a W film is formed to fill the pattern. Specifically, FIG. 2 illustrates a structure in which, on a $SiO_2$ film 101 having a recess pattern 102, a Mo film 104 is formed to fill the recess pattern 102 via an $Al_2O_3$ film 103 as a barrier film. In addition, FIG. 3 illustrates when a W film is used instead of the Mo film, a structure in which, on an $Al_2O_3$ film 103, a TiN film 105 is formed as a barrier film, and a W film 106 is formed on the TiN film 105.

Figure 4:
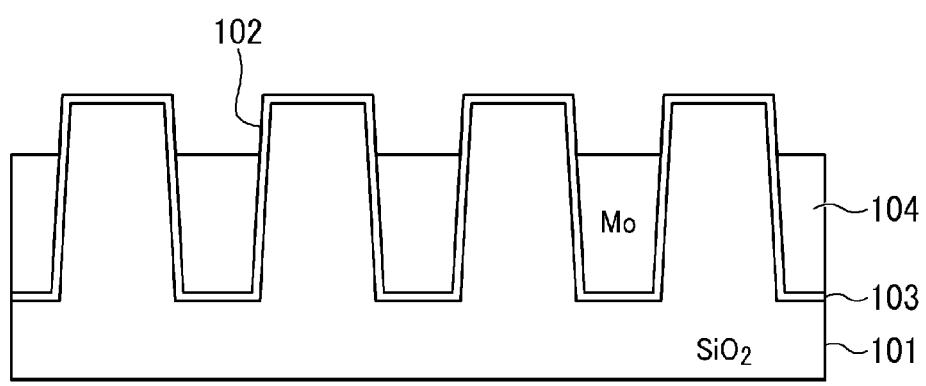
FIG. 4 is a cross-sectional view illustrating a state in which etching is performed on a substrate having the structure of FIG. 2
Figure 5:
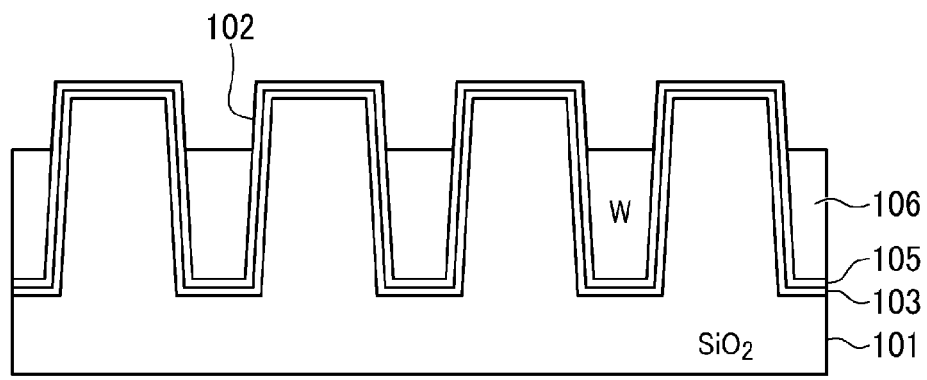
FIG. 5 is a cross-sectional view illustrating a state in which etching is performed on a substrate having the structure of FIG. 3

In Step 2, an oxidation gas and a hexafluoride gas as an etching gas are supplied to the substrate to etch the exposed Mo film or W film. For example, in the etching of the substrates having the structures illustrated in FIGS. 2 and 3, as illustrated in FIGS. 4 and 5, the Mo film 104 and the W film 106 are etched halfway through the recess patterns 102, respectively.

Any gas may be used as the oxidation gas, as long as the gas can oxidize the Mo film or the W film, and an $O_2$ gas may be preferably used. Additional examples of the oxidation gas may include an $O_3$ gas, a NO gas, a $N_2O$ gas, and the like.

Hexafluoride has a regular octahedral molecular structure in which six fluorine (F) atoms are arranged around the atom of an element to be fluorinated, and is stable without F that becomes a free radical. A hexafluoride gas reacts with oxides of Mo or W to produce highly volatile acid fluorides such as $MoOF_4$ and $WOF_4$. Therefore, the etching of the Mo film or the W film continues.

Meanwhile, the hexafluoride gas hardly reacts with Si-containing materials. Therefore, the Mo film or the W film can be etched with a high selectivity relative to the Si-containing material by using the oxidation gas and the hexafluoride gas. In addition, the hexafluoride gas also hardly reacts with $Al_2O_3$ and TiN, and the Mo film or the W film can be etched with a high selectivity relative to other materials other than Si-containing materials, such as $Al_2O_3$ and TiN.

As the hexafluoride gas, a $MoF_6$ gas, a $WF_6$ gas, and a $SF_6$ gas may be preferably used. Further, by using the $MoF_6$ gas when etching the Mo film and by using the $WF_6$ gas when etching the W film, it is possible to reduce the mixing of impurities into the film as much as possible.

Although only the oxidation gas and the hexafluoride gas may be used as the gases, an inert gas such as a $N_2$ gas or an Ar gas may be supplied in addition to these.

An internal pressure of the chamber when performing Step 2 may range from 1 to 700 Torr (133.3 to 93,326 Pa), from 1 to 100 Torr (133.3 to 133,332 Pa), and preferably from 10 to 100 Torr (1,333 to 13,332 Pa).

A temperature at which Step 2 is executed may range from 50 degrees C. to 500 degrees C., preferably from 50 degrees C. to 400 degrees C. When the $MoF_6$ gas is used as the hexafluoride gas, the temperature is preferably 50 to 300 degrees C., and when the $WF_6$ gas is used, the temperature is preferably 200 to 500 degrees C., more preferably 200 to 400 degrees C. As described above, when the $MoF_6$ gas is used, a preferable range exists on the lower temperature side.

When executing Step 2, the oxidation gas and the hexafluoride gas may be simultaneously supplied into the chamber (substrate), or these may be sequentially supplied. For example, Step 2 may be performed in sequences illustrated as sequences 1 to 4 below.

Figure 6:
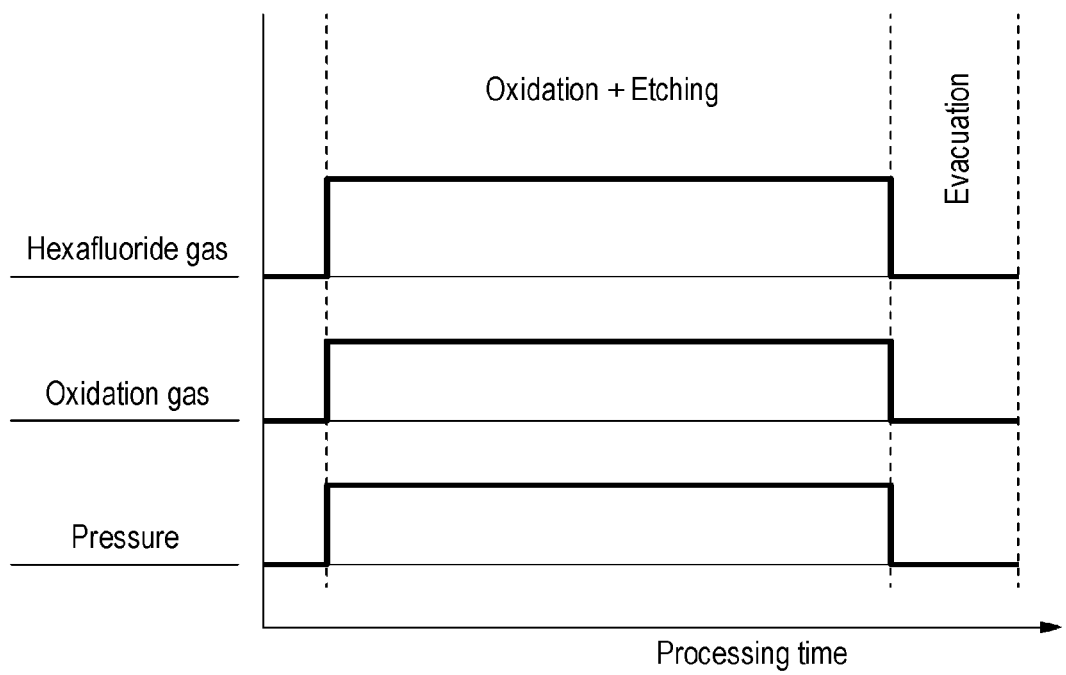
FIG. 6 is a timing chart illustrating sequence 1 which is an example of a sequence of a step of supplying an oxidizing gas and a hexafluoride gas in the etching method of the first embodiment.

In sequence 1, as illustrated in FIG. 6, the oxidation gas and the hexafluoride gas are simultaneously supplied into the chamber, oxidation and etching are simultaneously performed. Thereafter, the supply of the oxidation gas and the hexafluoride gas is stopped, and the interior of the chamber is evacuated. Oxidation+etching and evacuation may be completed only once, or may be repeated multiple times. In addition, a purge gas may be supplied at the time of evacuation. In the case of sequence 1, a ratio of the hexafluoride gas ($XF_6$) to the oxidation gas ($O_x$) ($XF_6:O_x$) may be set to 10:90 to 99.9:0.1. When the $MoF_6$ gas is used as the hexafluoride gas, it is possible to perform favorable etching substantially in this range. When the $WF_6$ gas is used as the hexafluoride gas, the preferable range of $XF_6:O_x$ is 20:80 to 90:10.

Figure 7:
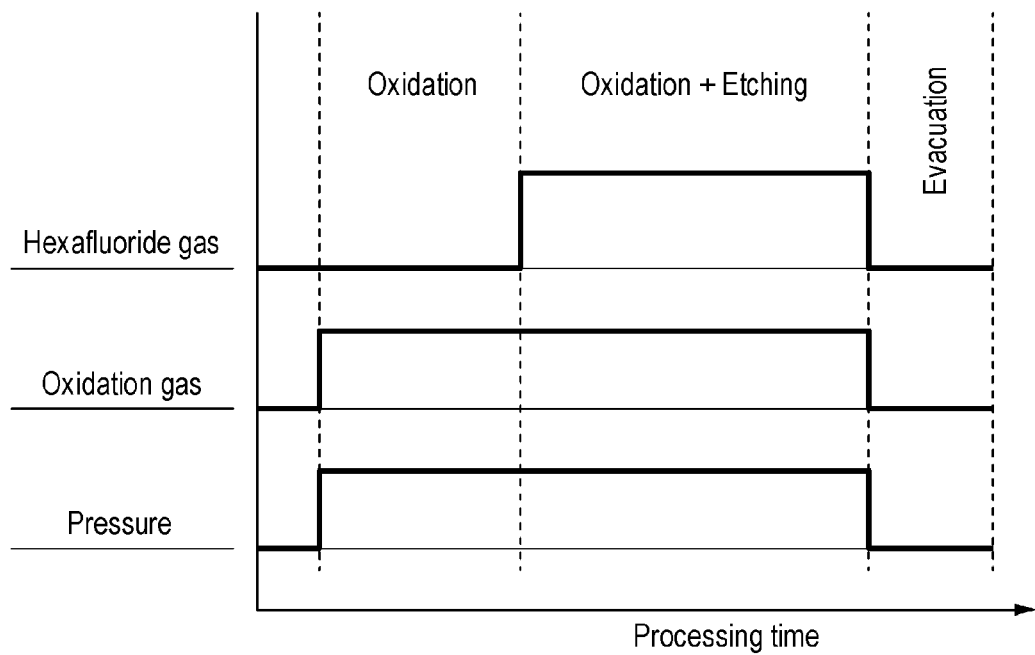
FIG. 7 is a timing chart illustrating sequence 2 which is an example of the sequence of the step of supplying the oxidizing gas and the hexafluoride gas in the etching method of the first embodiment.

In sequence 2, as illustrated in FIG. 7, the oxidation gas is first supplied into the chamber to perform oxidation, and while the oxidation gas is still flowing, the hexafluoride gas is supplied from the middle and oxidation and etching are simultaneously performed. Thereafter, the supply of the oxidation gas and the hexafluoride gas is stopped and the interior of the chamber is evacuated. The oxidation, the oxidation+etching, and the evacuation may be completed only once, or may be repeated multiple times. In addition, a purge gas may be supplied at the time of evacuation. In sequence 2, the range of $XF_6:O_x$ is the same as in sequence 1.

Figure 8:
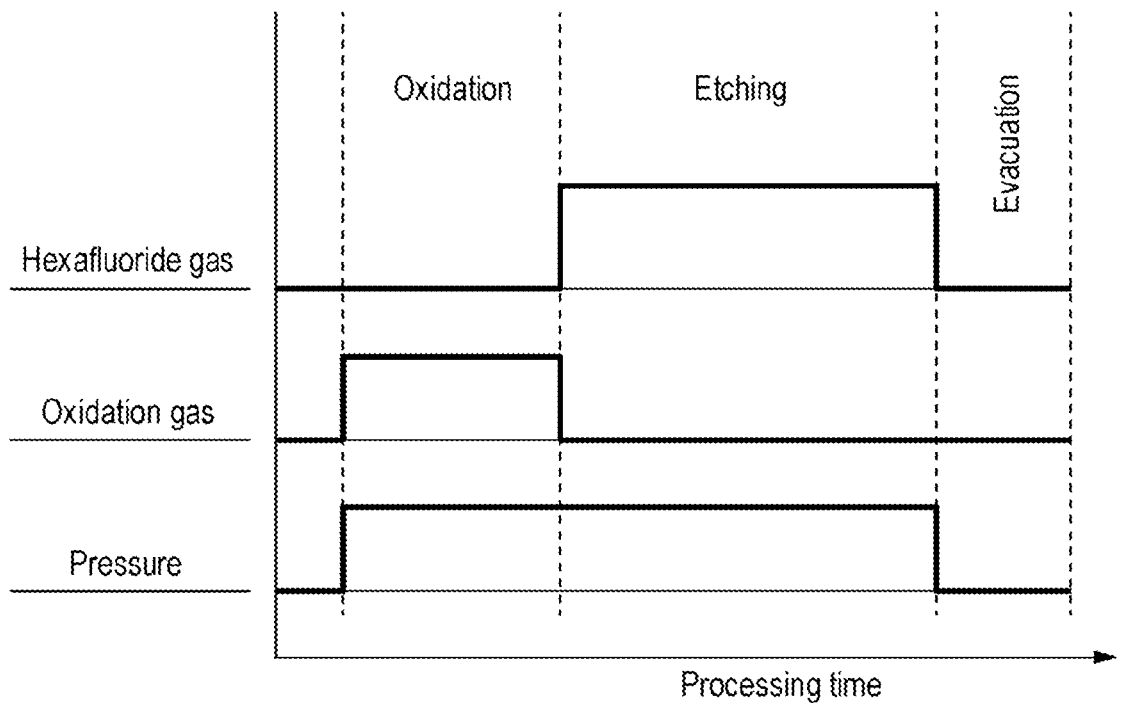
FIG. 8 is a timing chart illustrating sequence 3 which is an example of the sequence of the step of supplying the oxidizing gas and the hexafluoride gas in the etching method of the first embodiment.

Sequence 3 is a sequential process, and as illustrated in FIG. 8, first, the oxidation gas is supplied into the chamber to perform oxidation, and then the supply of the oxidation gas is stopped and the hexafluoride gas is supplied to perform etching. Thereafter, the supply of the hexafluoride gas is stopped and the interior of the chamber is evacuated. The oxidation, the etching, and the evacuation may be completed only once, or may be repeated multiple times. In addition, a purge gas may be supplied at the time of evacuation.

Figure 9:
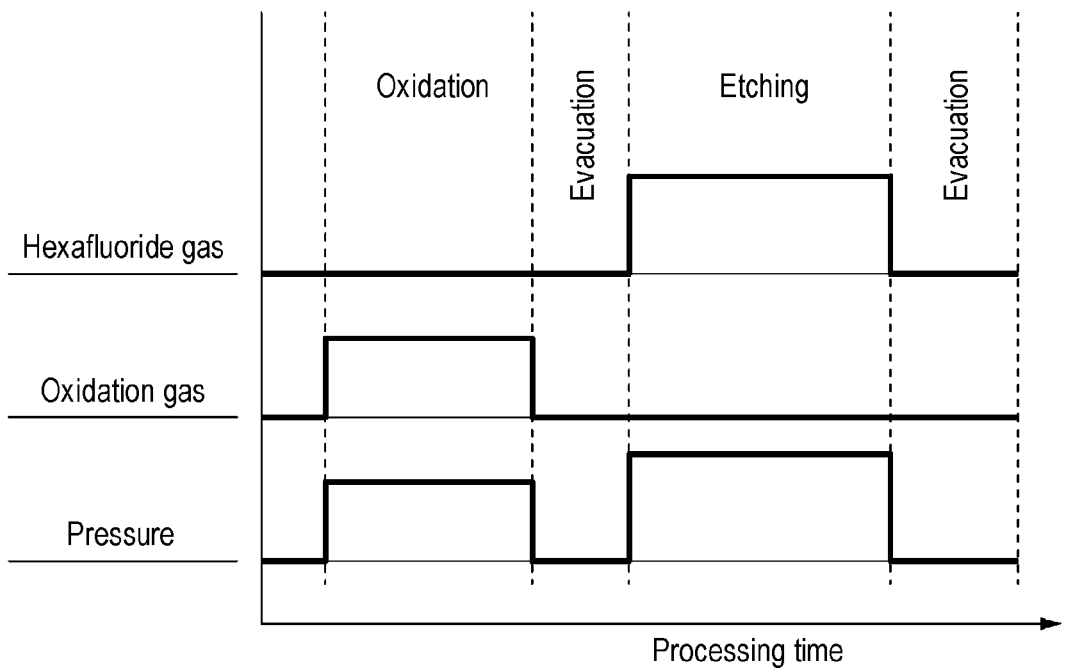
FIG. 9 is a timing chart illustrating sequence 4 which is an example of the sequence of the step of supplying the oxidizing gas and the hexafluoride gas in the etching method of the first embodiment.

As illustrated in FIG. 9, sequence 4 is a sequential process similar to sequence 3 and is different from sequence 3 only in that evacuation of the interior of the chamber is performed between the oxidation and the etching.

When the oxidation and the etching are performed simultaneously as in sequence 1 and sequence 2, there is an advantage that the processing speed is high. In particular, in the case of sequence 2, since the surface of the Mo film or the W film is first oxidized with the oxidation gas, and then the oxidation gas and the hexafluoride gas are supplied to simultaneously perform the oxidation and the etching, the processing speed may be made higher. However, in the case of sequence 1 and sequence 2, since the etching proceeds from a portion in which the reaction is likely to occur, a loading effect due to a difference in density of the pattern or a high aspect ratio may become a problem.

In contrast, as in sequence 3 and sequence 4, by alternately supplying the oxidation gas and the hexafluoride gas, it is possible to control the oxidation and the etching of the Mo film or the W film separately, and thus the loading effect is less likely to occur. That is, since the etching reaction proceeds only in the oxidized portion of the Mo film or the W film, a difference in etching rate due to a difference in the density of patterns or the like is difficult to occur. In addition, in sequence 4, since evacuation is performed between the oxidation and the etching, it is possible to further improve the controllability of the reaction. However, since the oxidation and the etching are performed separately, the etching can only be performed in small amounts, which slows down the processing speed.

These sequences 1 to 4 may be appropriately used depending on what points are emphasized according to the structure of the apparatus and the content of processing.

After Step 2, the substrate may be subjected to post-processing such as residue removal.

By etching the Mo film or the W film with the oxidation gas and the hexafluoride gas as described above, in any of the above sequences 1 to 4, it is possible to obtain a high etching selectivity of 50 or more relative to the Si-containing material. In addition, by optimizing the conditions, it is possible to obtain an extremely high etching selectivity of 100 or more, and even 450 or more. In particular, relative to a Si film, a higher etching selectivity of 5,000 or more is obtained. In addition, even relative to another material, other than the Si-containing material, such as an $Al_2O_3$ film or a TiN film, it is possible to obtain a high etching selectivity of 50 or more. In particular, relative to the $Al_2O_3$ film, an extremely high etching selectivity of 1,000 or more is obtained.

Patent Document 1 discloses selectively etching a tungsten film relative to a Si-containing film through plasma etching using a $Cl_2$ gas, an $O_2$ gas, and a $N_2$ gas. However, the etching selectivity of the tungsten film relative to the Si-containing film is about 1.5 to 4, and it is not possible to implement an extremely high etching selectivity of 50 or more and even 450 or more as in the present embodiment. That is, in the present embodiment, it is possible to etch, through plasma-free gas etching, a Mo film or a W film with a high etching selectivity that cannot be obtained through the plasma etching disclosed in Patent Document 1.

In addition, as described above, by sequentially supplying the oxidation gas and the hexafluoride gas, the effect of effectively suppressing a loading effect due to a difference in the density of patterns and a high aspect ratio is also obtained.

Furthermore, by using the $MoF_6$ gas as the hexafluoride gas, etching is possible at a lower temperature, which is effective against device damage due to heat load.

Second Embodiment

Figure 10:
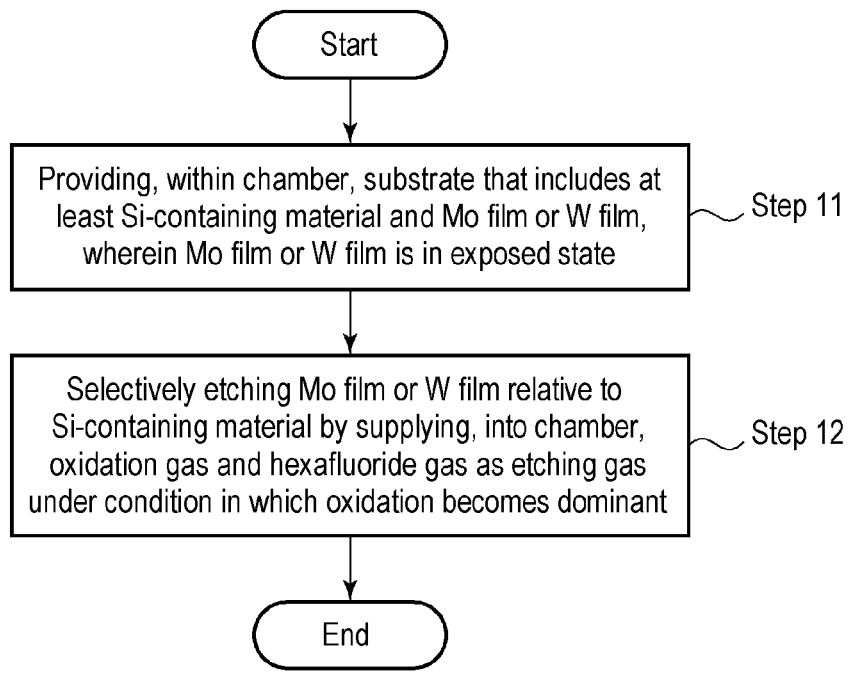
FIG. 10 is a flowchart illustrating an example of an etching method according to a second embodiment.

FIG. 10 is a flowchart illustrating an example of an etching method according to a second embodiment. In the etching method of this example, first, a substrate including at least a Si-containing material and a Mo film or a W film which is in an exposed state, is provided within the chamber (step 11). The Mo film or the W film is selectively etched relative to Si-containing material by supplying, into the chamber, an oxidation gas and a hexafluoride gas as an etching gas under the conditions in which oxidation becomes dominant (step 12).

In the present embodiment, the main purpose is to suppress the expansion of vacancy exposed by etching when the vacancy such as a seam is present in the Mo film or the W film. That is, if a seam is present in the Mo film or the W film, the hexafluoride gas enters the seam when the seam is exposed by the etching, and the seam expands to grow into a larger pit. In addition, there are some pits larger than the seam in the Mo film or the W film, and even when the pits are exposed, the hexafluoride gas enters the pits, resulting in larger pits. In the present embodiment, by etching the Mo film or the W film under conditions in which the oxidation is dominant, the etched surface is maintained in the oxidized state. Since the vacancy portions of seams or pits exposed on the etched surface are also oxidized and thus the frontages thereof swell, it becomes difficult for the hexafluoride gas to enter the vacancy of seams or pits. Therefore, the etching proceeds in the state in which the expansion of vacancy of seams or pits is suppressed.

Details will be described below.

In step 11, the substrate to be etched is not particularly limited as in the first embodiment, and a semiconductor wafer having a semiconductor substrate such as Si is used as an example. Examples of the Si-containing material may include Si, $SiO_2$, and SiN as in the first embodiment, and these may be a Si film, a $SiO_2$ film, and a SiN film. The Si as the Si-containing material may be the substrate itself.

As in the first embodiment, the Mo film and the W film may be formed through a usually-used film forming technique, and examples thereof may include those formed through CVD, ALD, and PVD.

The substrate may include those other than the Mo film or the W film and the Si-containing material as in the first embodiment. For example, the substrate may include, under the Mo film or the W film, at least one of an $Al_2O_3$ film and a TiN film as a barrier film.

The structure of the substrate is not particularly limited as long as it includes a Si-containing material and a Mo film or a W film which is in an exposed state, as in the first embodiment. Examples of the structure may include a structure in which, on a Si-containing film having a given pattern formed thereon, a Mo film or a W film is formed to fill the pattern. In the present embodiment, since the main purpose is to suppress the growth of a seam in the Mo film or the W film into a pit when exposed in the process of etching, the present embodiment is particularly effective in the case in which the substrate has a structure in which a seam is likely to occur. For example, the substrate may be a substrate having the structure illustrated in FIG. 11.

Figure 11:
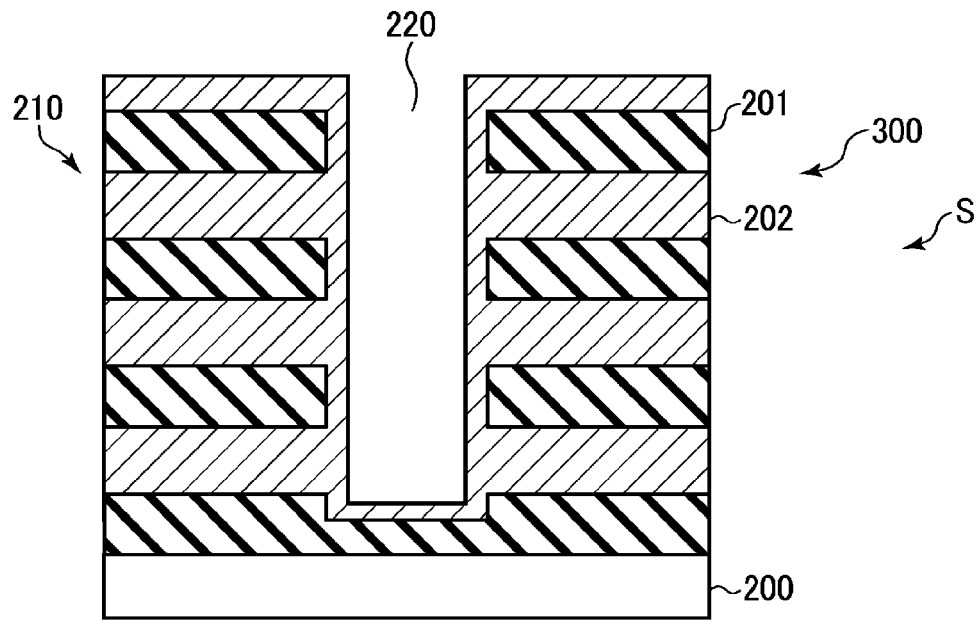
FIG. 11 is a cross-sectional view schematically illustrating an example of a structure of a substrate to which the etching method according to the second embodiment is applied.

The substrate S illustrated in FIG. 11 is configured by using a silicon wafer in which a three-dimensional structure 300 including a Mo film on a silicon substrate 200 is formed.

The structure 300 includes a laminated portion 210, in which $SiO_2$ films 201 and Mo films 202 are alternately laminated, and a groove (slit) 220 provided in the laminating direction of the laminated portion 210. A Mo film 202 is also formed on the inner wall of the slit 220. The number of laminated portions 210 is actually about several tens of layers, and the height is about several μm to 10 μm. W films may be used instead of the Mo films, but in that case, respective barrier films, such as TiN films, are required between the $SiO_2$ films and W films. In the case of the Mo films as well, respective barrier films, such as $Al_2O_3$ films, may be provided between the Mo films and the $SiO_2$ films. Further, instead of the $SiO_2$, films of another silicon-containing material, such as Si or SiN, may be used, or films other than silicon-containing material films may be used.

In the substrate S having this structure, the Mo films 202 of the laminated portion 210 are etched through the slit 220. Seams are likely to occur in the laminated portion 210 of the Mo film 202 during film formation, and the number of seams tends to increase toward the inner side of the laminated portion 210.

Figure 12:
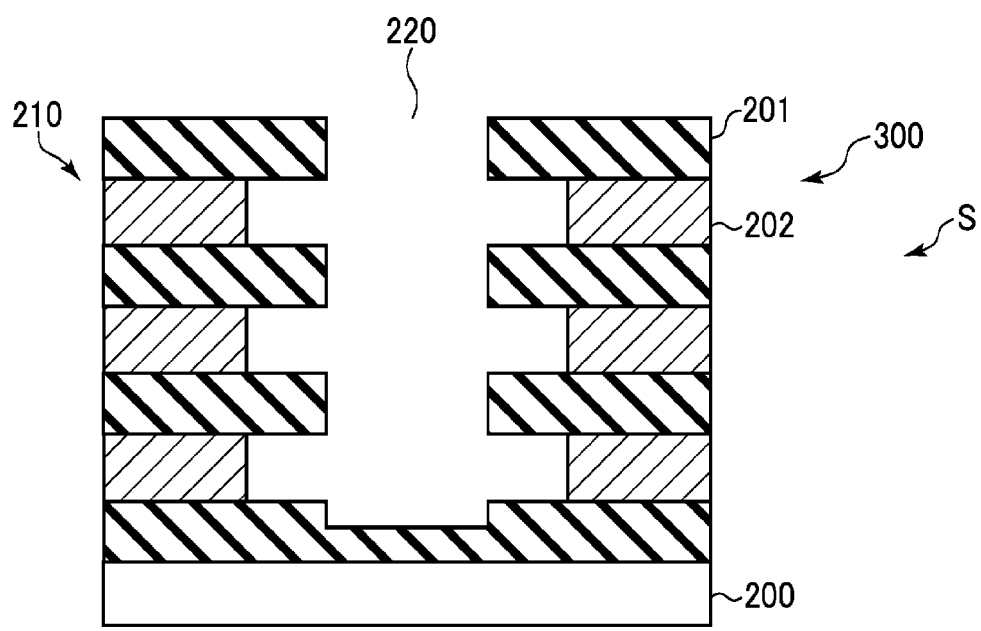
FIG. 12 is a cross-sectional view schematically illustrating a state in which etching is performed on the substrate of FIG. 11.

In step 12, as in step 2 of the first embodiment, an oxidation gas and a hexafluoride gas as an etching gas are supplied to the substrate to etch the Mo film or the W film. For example, in the etching of the substrate having the structure illustrated in FIG. 11, the Mo films 202 are etched halfway as illustrated in FIG. 12.

In this embodiment as well, the oxidation gas may be any gas as long as it can oxidize the Mo film or the W film, and an $O_2$ gas may be preferably used. Examples of the oxidation gas may include an $O_3$ gas, a NO gas, a $N_2O$ gas, and the like. As the hexafluoride gas, a $MoF_6$ gas, $WF_6$ gas, and a $SF_6$ gas may be preferably used. Although only the oxidation gas and the hexafluoride gas may be used as the gases, an inert gas such as a $N_2$ gas or an Ar gas may be supplied in addition to these.

Figure 13:
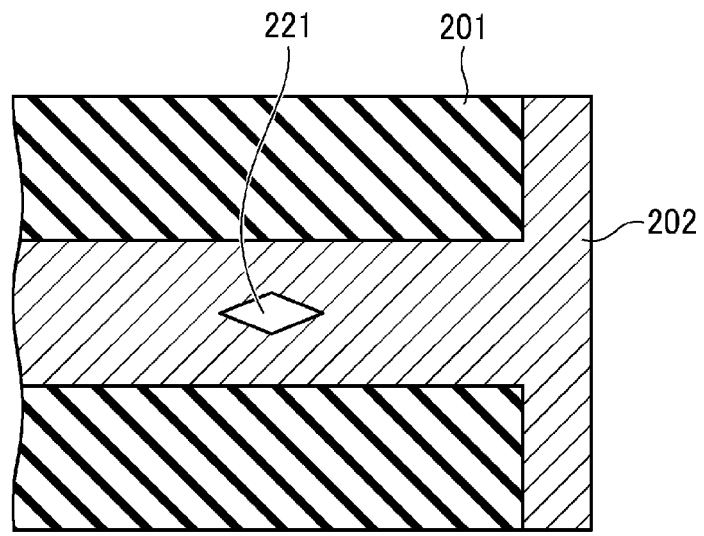
FIG. 13 is a cross-sectional view schematically illustrating a state in which a seam is present in a Mo film of the substrate of FIG. 11.
Figure 14:
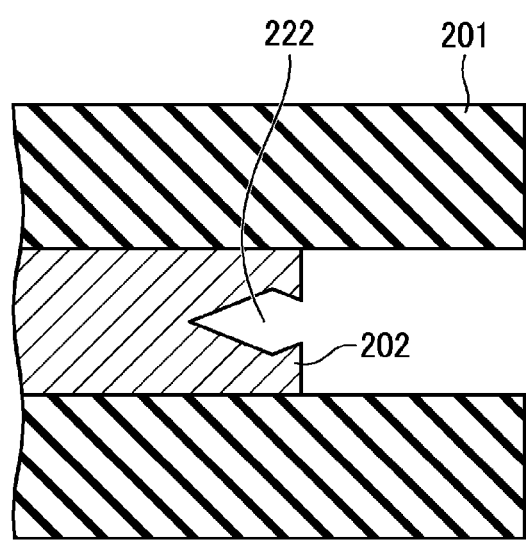
FIG. 14 is a cross-sectional view schematically illustrating a state in which a seam existing in the Mo film of the substrate of FIG. 11 is exposed by etching and expanded into a pit.

For example, in the structure as illustrated in FIG. 11, as schematically illustrated in FIG. 13, seams 221 are present in portions of the laminated portion 210 of Mo films 202 (some of which are pits larger than the seams). When the etching of the Mo films 202 proceeds to a position at which the seam 221 is present in this state, the hexafluoride gas enters the seam 221 and the seam 221 expands to become a pit 222 larger than the seam, as illustrated in FIG. 14. In addition, even when there is a pit, the hexafluoride gas will enter the pit, resulting in a larger pit.

In the present embodiment, in step 12, the etched surface and the portion of the seam 221 are kept in an oxidized state and expansion of the exposed seam 221 is suppressed by performing the etching under the conditions in which the oxidation by the oxidation gas is dominant compared to the etching by the hexafluoride gas.

Specifically, in the case of so-called CVE, which mainly consists of a period in which the oxidation gas and the hexafluoride gas are simultaneously supplied as in sequences 1 and 2 described above, by adjusting a flow rate ratio of the oxidation gas and the hexafluoride gas (a flow rate of the oxidation gas/a flow rate of the hexafluoride gas), specifically, by increasing the flow rate ratio, it is possible to make oxidation dominant. The flow rate ratio of the oxidation gas to the hexafluoride gas (the flow rate of the oxidation gas/the flow rate of the hexafluoride gas) is preferably set to 2 or more. In addition, in the case of so-called ALE in which the oxidation gas and the hexafluoride gas are sequentially supplied as in the above-mentioned sequences 3 and 4, it is possible to make the oxidation dominant by increasing the period for supplying the oxidation gas. A ratio of the time for supplying the oxidation gas to the time for supplying the hexafluoride gas (the time for supplying the oxidation gas/the time for supplying the hexafluoride gas) is preferably set to 1 or more.

A mechanism by which the expansion of a seam is suppressed by making oxidation dominant in this way will be described below.

Figure 15A:
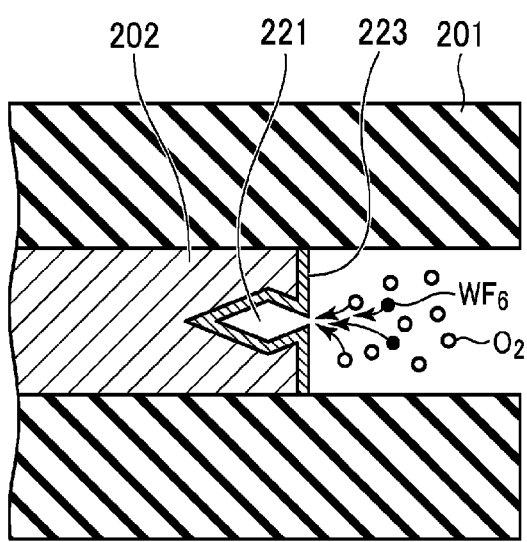
FIGS. 15A and 15B are cross-sectional views for explaining a mechanism for suppressing expansion of a seam when a Mo film is etched through CVE using an $O_2$ gas and a $WF_6$ gas on the substrate of FIG. 11.
Figure 15B:
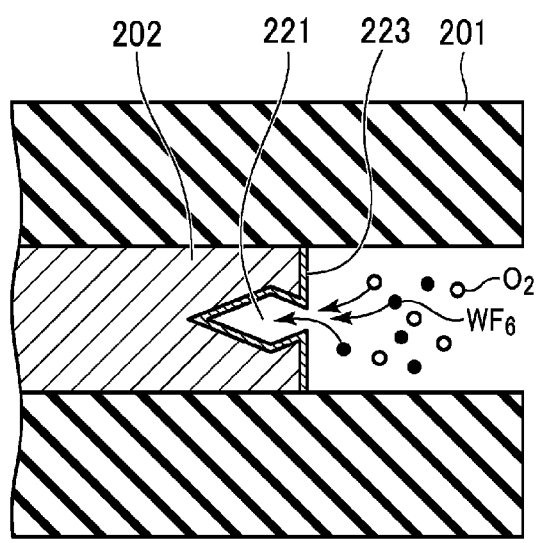

First, a case in which a Mo film 202 is etched through CVE using an $O_2$ gas as an oxidation gas and a $WF_6$ gas as an etching gas in the substrate S of FIG. 11 will be described as an example. In this case, the etching proceeds with the $WF_6$ gas while oxidating the Mo film 202 with the $O_2$ gas. At this time, when the oxidation gas is rich to make the oxidation dominant (e.g., $O_2/WF_6$=3 to 7), as illustrated in FIG. 15A, the oxidation gas is abundant, so that an oxide film 223 is formed on the etched surface of the Mo film 202, and the seam 221 exposed on the etched surface is also in an oxidized state. Therefore, the frontage of the seam 221 swells and narrows due to oxidation, and it is difficult for the $WF_6$ to enter the inner portion of the seam 221, so that the etching proceeds in the state in which the expansion of the seam 221 is suppressed. In contrast, when the amount of the $O_2$ gas as an oxidation gas is small and the oxidation is not dominant, since the oxidation gas is not abundant as illustrated in FIG. 15B, even when the seam 21 is similarly in the oxidized state, the oxidized portion is immediately scraped by the $WF_6$ gas. Therefore, the frontage of the seam 221 becomes wide, the $WF_6$ enters the inner portion of the seam 221, and the seam 221 expands and grows into a pit.

Figure 16B:
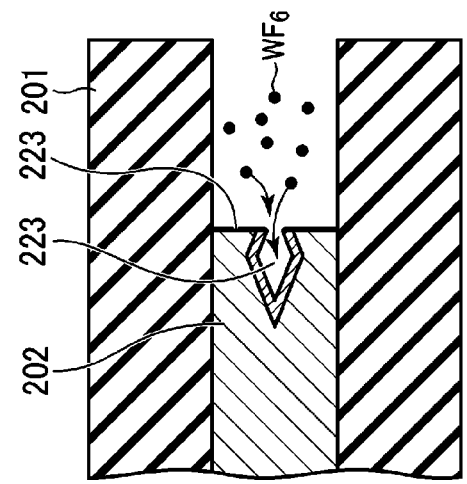
FIGS. 16A to 16C are cross-sectional views for explaining a mechanism for suppressing expansion of a seam when a Mo film is etched through ALE using $O_2$ gas and $WF_6$ gas on the substrate of FIG. 11.
Figure 16C:
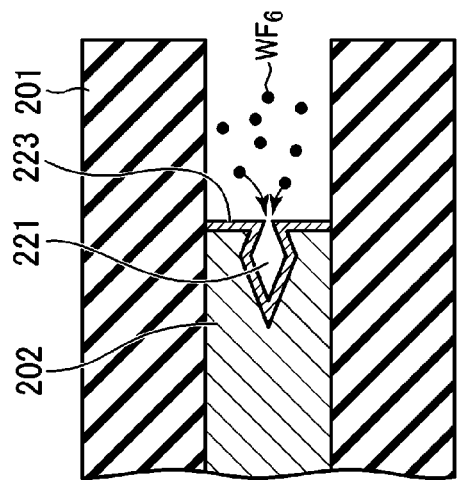
Figure 16A:
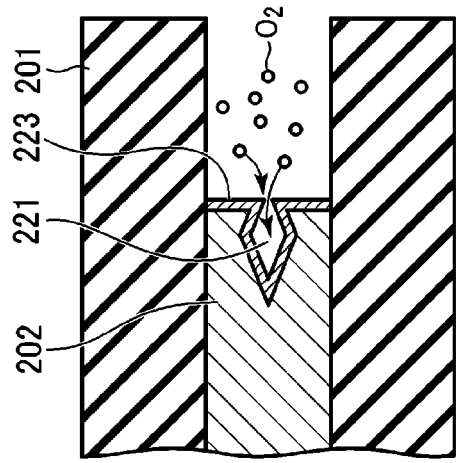

Next, a case in which a Mo film 202 is etched through ALE using an $O_2$ gas as an oxidation gas and a $WF_6$ gas as an etching gas in the substrate S of FIG. 11 will be described as an example. In this case, after supplying the $O_2$ gas to oxidate the Mo film 202, etching proceeds by repeating a cycle of supplying the $WF_6$ gas and etching the oxidized portion. When the $O_2$ gas as the oxidation gas is first supplied (e.g., supply time=360 sec), an oxide film 223 is formed on the etched surface of the Mo film 202 and the seam 221 exposed on the etched surface is also in the oxidized state, as illustrated in FIG. 16A. Therefore, the frontage of the seam 221 swells and narrows due to oxidation. Subsequently, the $WF_6$ gas as the etching gas is supplied, but when the etching time at that time is short (e.g., 15 to 30 sec), as illustrated in FIG. 16B, it is difficult for $WF_6$ to enter the inner portion of the seam 221 because the etching amount of the frontage portion of the seam 221 is small. In contrast, when the etching time is long (e.g., 60 to 360 sec), as illustrated in FIG. 16C, most of the oxide film on the etched surface is scraped. Therefore, the frontage of the seam 221 becomes wide, and the $WF_6$ easily enters the inner portion of the seam 221.

The internal pressure and internal temperature of the chamber when step 12 is executed are the same as those in step 2 in the first embodiment.

Next, another more practical example of the etching method according to the second embodiment will be explained.

For example, when the Mo film 202 is etched on the substrate having the structure of FIG. 11 described above, the seam tends to be relatively small in the inner wall portion of the slit 220 of the Mo film 202 and in the portion near the slit 220 of the laminated portion 210. Meanwhile, there is a tendency that there are many seams in the inner portion of the laminated portion 210. For this reason, it is preferable to identify the portion in which the number of seams starts to increase, to perform etching up to that portion under normal conditions in which the etching rate is emphasized, and, after that portion, to perform etching under the conditions for suppressing the expansion of the above-described seams.

Figure 17:
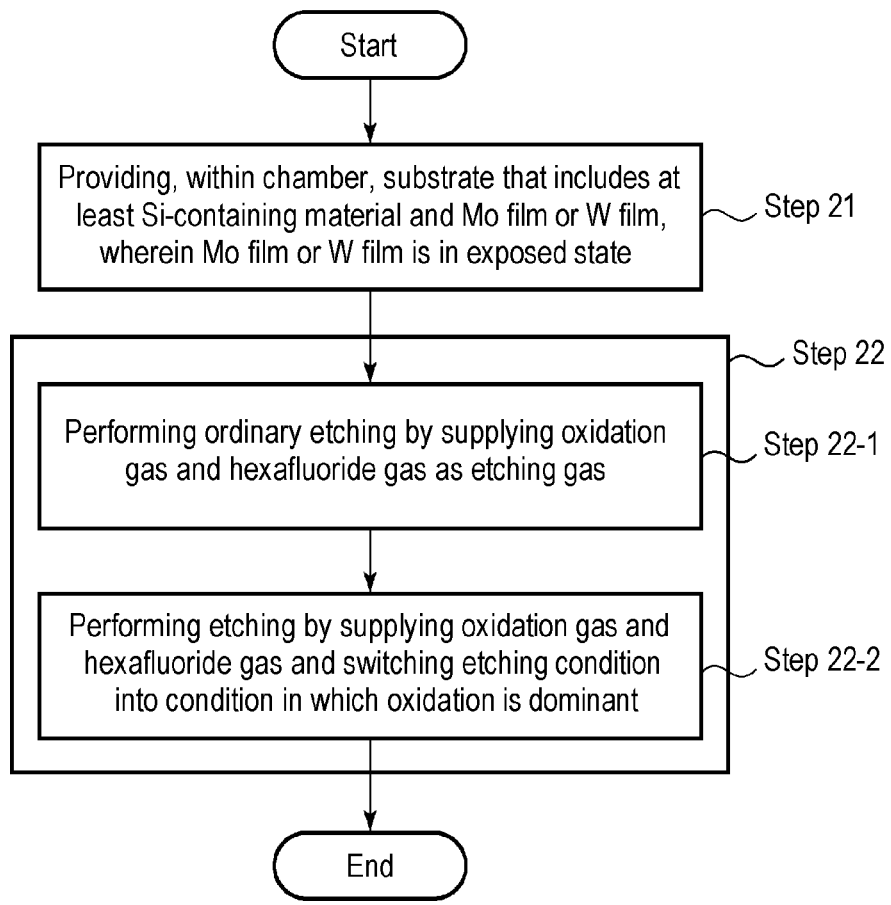
FIG. 17 is a flowchart illustrating another example of the etching method according to the second embodiment.

FIG. 17 is a flowchart illustrating another example of the etching method according to the second embodiment.

In the etching method of this example, first, a substrate including at least a Si-containing material and a Mo film or a W film which is in an exposed state, is provided within the chamber (step 21). Subsequently, an oxidation gas and a hexafluoride gas as an etching gas are supplied into the chamber, and the Mo film or the W film is selectively etched relative to the Si-containing material through a first stage and a second stage (step 22). In the first stage, ordinary etching is performed by supplying the oxidation gas and the hexafluoride gas as the etching gas (step 22-1). In the second stage, etching is performed by supplying the oxidation gas and the hexafluoride gas, and switching the etching condition into a condition in which oxidation becomes dominant (step 22-2).

By the etching method of the present example, in the etching of the Mo film or the W film, the portion with few seams at the initial stage is etched under the condition in which etching characteristics such as etching rate are emphasized, and only the latter stage portion with many seams may be etched under the condition in which the oxidation is dominant as described above.

The first stage etching and the second stage etching may be either CVE or ALE, or any of sequences 1 to 4 of the first embodiment. The first stage may be performed under the same conditions as those in step 2 of the first embodiment. The second stage may be performed under the same conditions as in step 12. When both the first stage etching and the second stage etching are CVE, it is preferable to set the pressure during etching to be higher in the first etching than in the second etching. By increasing the pressure, it is possible to increase the etching rate. In addition, it is preferable to set the flow rate ratio of the oxidation gas to the hexafluoride gas (the flow rate of the oxidation gas/the flow rate of the hexafluoride gas) to be higher in the second stage than in the first stage. When both the first stage etching and the second stage etching are ALE, it is preferable to set the pressure for supplying the etching gas to be higher in the first etching than in the second etching. In addition, the ratio of the time for supplying the oxidation gas to the time for supplying the hexafluoride gas (the time for supplying the oxidation gas/the time for supplying the hexafluoride gas) is higher in the second stage than in the first stage.

<Etching Apparatus>

Next, an example of an etching apparatus for executing the etching methods according to the first and second embodiments will be described.

Figure 18:
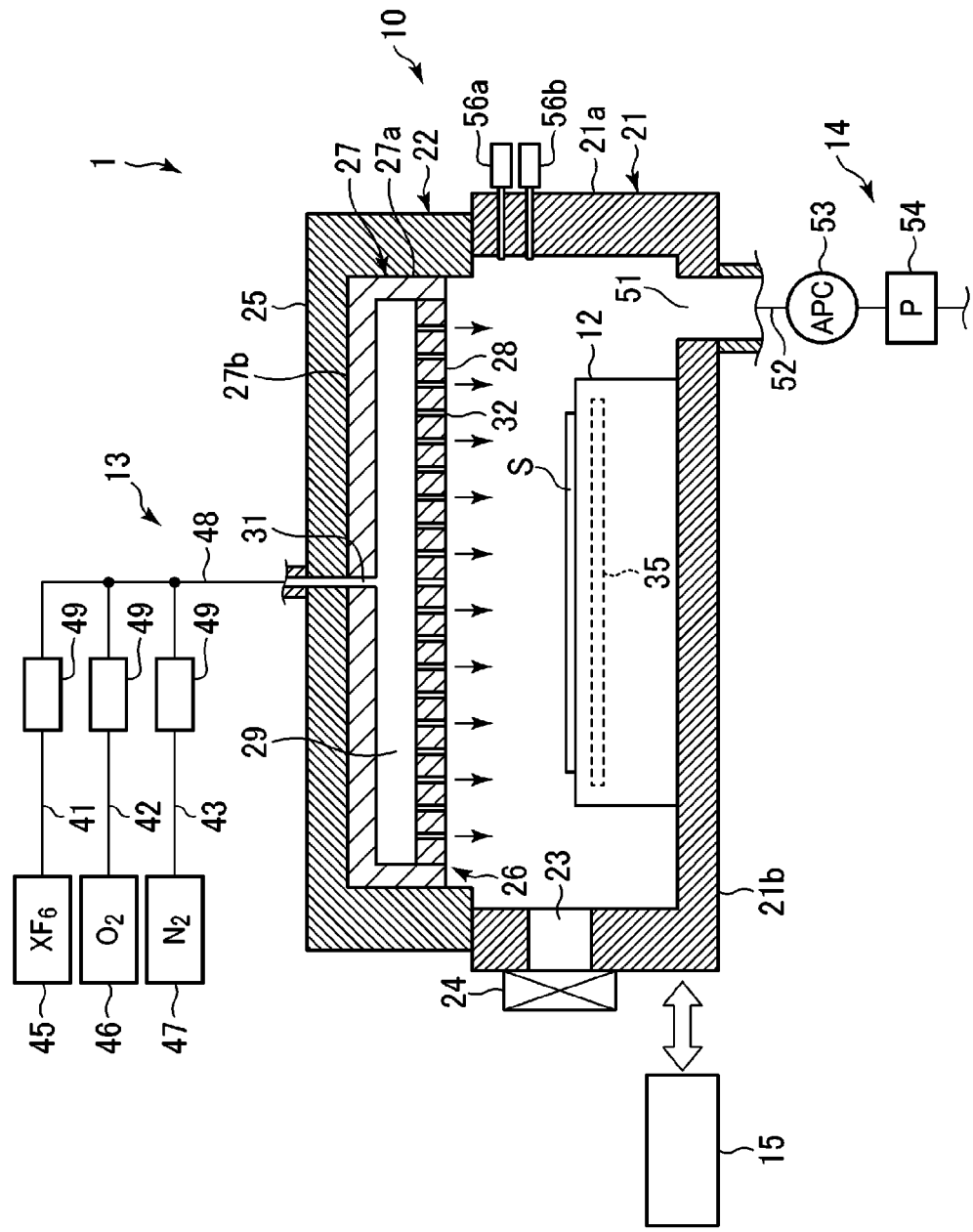
FIG. 18 is a cross-sectional view illustrating an example of an etching apparatus for executing the etching methods according to the first and second embodiments.

FIG. 18 is a cross-sectional view illustrating an example of the etching apparatus for performing the etching method according to the first embodiment.

As illustrated in FIG. 18, an etching apparatus 1 includes a chamber 10 having a sealed structure. Inside the chamber 10, a stage 12 on which a substrate S is placed in a horizontal posture is provided. The substrate S includes a Si-containing material and a Mo film or a W film which is in an exposed state. The etching apparatus 1 further includes a gas supply mechanism 13 configured to supply an etching gas to the chamber 10, an exhaust mechanism 14 configured to evacuate the interior of the chamber 10, and a controller 15.

The chamber 10 includes a chamber main body 21 and a lid part 22. The chamber main body 21 includes a substantially cylindrical sidewall portion 21a and a bottom portion 21b. An upper portion of the chamber main body 21 is open to form an opening. The opening is closed by the lid part 22. The sidewall portion 21a and the lid part 22 are sealed by a sealing member (not illustrated) to ensure the airtightness of the interior of the chamber 10.

The lid part 22 includes a lid member 25 constituting an appearance, and a shower head 26 fitted inward of the lid member 25 and provided to face the stage 12. The shower head 26 includes a main body 27 having a cylindrical sidewall 27a and an upper wall 27b, and a shower plate 28 provided in the bottom portion of the main body 27. A space 29 is formed between the main body 27 and the shower plate 28.

A gas introduction path 31 is formed through the lid member 25 and the upper wall 27b of the main body 27 to the space 29. A pipe 48 of the gas supply mechanism 13, which will be described later, is connected to the gas introduction path 31.

A plurality of gas ejection holes 32 are formed in the shower plate 28. The gas introduced into the space 29 through the pipe 48 and the gas introduction path 31 is ejected from the gas ejection holes 32 into the space inside the chamber 10.

The sidewall portion 21a is provided with a carry-in/out port 23 through which a wafer W is carried in/carried out. The carry-in/out port 23 is configured to be openable/closable by a gate valve 24.

The stage 12 has a substantially circular shape in a plan view, and is fixed to the bottom portion 21b of the chamber 10. Inside the stage 12, a temperature controller 35 configured to control a temperature of the stage 12 to control a temperature of the substrate S placed on the stage 12 is provided. The temperature controller 35 includes a heater configured to heat, for example, the stage 12, and controls the temperature of the substrate S on the stage 12 by controlling an output of the heater by using a heater controller (not illustrated). Depending on the temperature of the substrate S, the temperature controller 35 may be provided with a conduit through which a temperature control medium (e.g., water) circulates. In this case, the temperature of the substrate S is controlled by causing the temperature control medium having a predetermined temperature to pass through the conduit. In the vicinity of the substrate S placed on the stage 12, a temperature sensor (not illustrated) is provided to detect the temperature of the substrate S.

The gas supply mechanism 13 includes a hexafluoride gas source ($XF_6$) 45 for supplying the hexafluoride gas, an $O_2$ gas source 46 for supplying the $O_2$ gas as an oxidation gas, and a $N_2$ gas source 47 for supplying the $N_2$ gas as an inert gas, to which one ends of a hexafluoride gas supply pipe 41, an $O_2$ gas supply pipe 42, and a $N_2$ gas supply pipe 43 are connected, respectively. The other ends of the hexafluoride gas supply pipe 41, the $O_2$ gas supply pipe 42, and the $N_2$ gas supply pipe 43 are connected to a common pipe 48, and the pipe 48 is connected to the above-described gas introduction path 31. The hexafluoride gas supply pipe 41, the $O_2$ gas supply pipe 42, and the $N_2$ gas supply pipe 43 are each provided with a flow rate controller 49 configured to control the opening/closing of the flow path and a flow rate. The flow rate controller 49 is configured with a flow rate controller such as an opening/closing valve and a mass flow controller.

Therefore, the hexafluoride gas, the $O_2$ gas as the oxidation gas, and the $N_2$ gas as the inert gas are introduced into the shower head 26 from the gas sources 45, 46, and 47 via the pipes 41, 42, 43, and 48, respectively, and ejected from the gas ejection holes 32 of the shower plate 28 into the chamber 10.

The exhaust mechanism 14 includes an exhaust pipe 52 connected to an exhaust port 51 formed in the bottom portion 21b of the chamber 10, and includes an automatic pressure control valve (APC) 53 provided in the exhaust pipe 52 to control the internal pressure of the chamber 10 and a vacuum pump 54 configured to evacuate the interior of the chamber 10.

Two capacitance manometers 56a and 56b, one for high pressure and one for low pressure, are provided on the sidewall of the chamber 10 as pressure gauges for measuring the internal pressure of the chamber 10 so as to be inserted into the chamber 10. The degree of opening of the automatic pressure control valve (APC) 53 is adjusted based on the values detected by the capacitance manometers 56a and 56b, so that the internal pressure of the chamber 10 is controlled.

The controller 15 typically includes a computer, and has a main controller having a CPU that controls each component of the etching apparatus 1. In addition, the controller 15 further includes an input device (e.g., a keyboard, a mouse, or the like), an output device (e.g., a printer or the like), a display device (e.g., a display or the like), and a storage device (e.g., a storage medium), which are connected to the main controller. The main controller of the controller 15 causes the etching apparatus 1 to execute a predetermined operation based on, for example, a processing recipe stored in a storage medium built in a storage device or a storage medium set in the storage device.

In this etching apparatus 1, the substrate S having the above-described structure is carried into the chamber 10 and is placed on the stage 12. Then, the temperature controller 35 controls the temperature of the substrate S to a predetermined temperature in the range of, for example, 50 to 500 degrees C., and controls the internal pressure of the chamber 10 to a predetermined pressure in the range of, for example, 1 to 700 Torr (133.3 to 93,326 Pa).

Subsequently, the Mo film or the W film of the substrate S is etched through the first embodiment or the second embodiment by using the $O_2$ gas as an oxidation gas and the hexafluoride gas as an etching gas. At the time of this etching, it is possible to etch the Mo film or the W film with a high etching selectivity of 50 or more relative to a Si-containing material such as a $SiO_2$ film. In addition, a high etching selectivity of 50 or more is obtained even relative to an $Al_2O_3$ film, a TiN film, or the like.

After the etching is terminated and the interior of the chamber 10 is evacuated, the interior of the chamber 10 is purged with a $N_2$ gas as an inert gas, if necessary, and then the substrate S is carried out from the chamber 10. The inert gas ($N_2$ gas) may be used as a diluting gas during etching.

After the etching, a post-process such as residue removal may be performed inside the chamber 10 or in another chamber.

EXPERIMENTAL EXAMPLES

Next, experimental examples will be described. Of the following experimental examples, Experimental Examples 1 to 3 relate to the first embodiment, and Experimental Examples 4 to 5 relate to the second embodiment.

Experimental Example 1

Here, a sample having a Mo film (ALD-Mo film) formed through ALD on a bare wafer and a sample having a Mo film (PVD-Mo film) formed through PVD on a bare wafer were prepared and etched. The etching was performed by using the $O_2$ gas as the oxidation gas and the $WF_6$ gas as the hexafluoride gas through the above-described sequence 1 (simultaneous supplying the $O_2$ gas and the $WF_6$ gas). In addition to the $O_2$ gas and the $WF_6$ gas, the $N_2$ gas was supplied as a diluting gas. At that time, the temperature of the stage was changed from 260 to 400 degrees C., the pressure was changed from 5 to 100 Torr, and the ratio of the $WF_6$ gas to the $O_2$ gas+$WF_6$ gas was changed from 20 to 90% ($WF_6:O_2$=20:80 to 90:10), and the etching rate under each condition was obtained.

Figure 19:
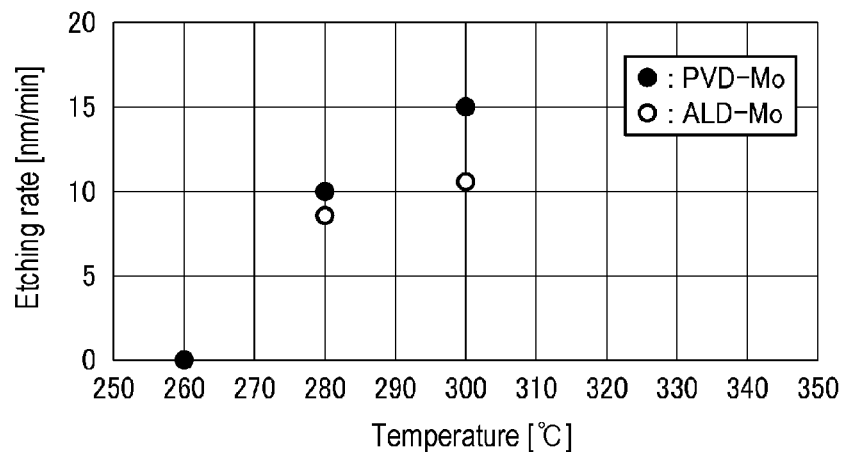
FIG. 19 is a view illustrating a dependency of an etching rate on a temperature in Experimental Example 1.
Figure 20:
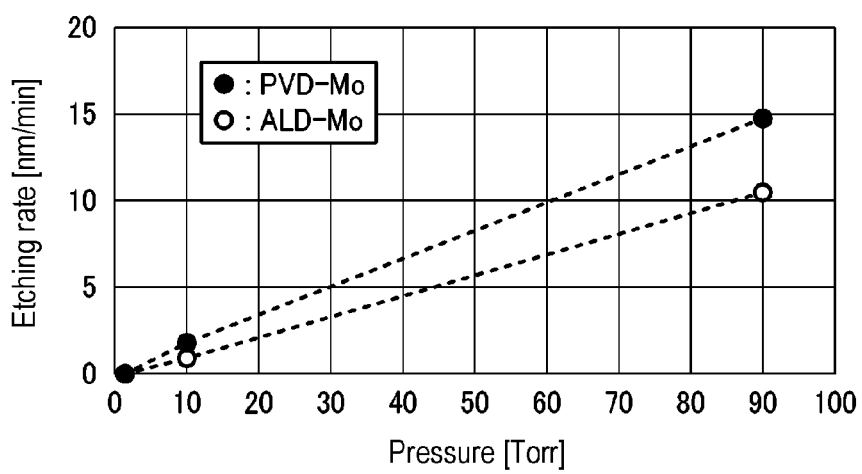
FIG. 20 is a view illustrating a dependency of the etching rate on a pressure in Experimental Example 1.
Figure 21:
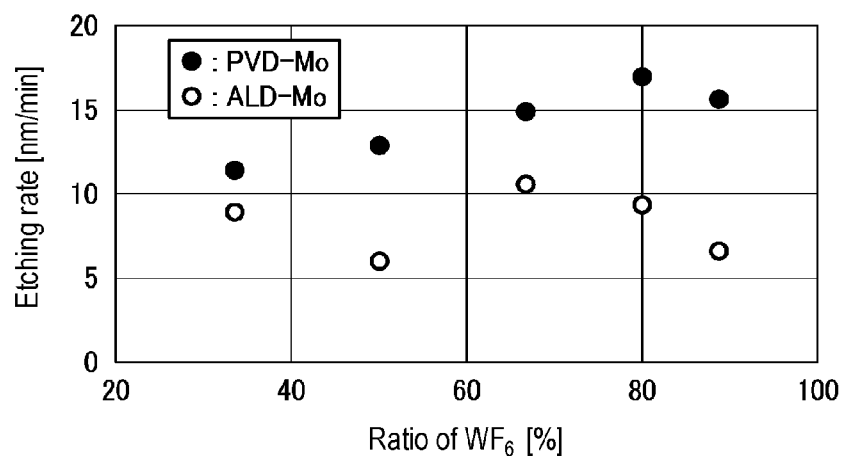
FIG. 21 is a view illustrating a dependency of the etching rate on a gas ratio in Experimental Example 1.

At this time, dependency of the etching rate on temperature, pressure and gas ratio are shown in FIGS. 19, 20, and 21, respectively. As shown in FIGS. 19 and 20, it was possible to etch both the ALD-Mo film and the PVD-Mo film by using the $O_2$ gas and the $WF_6$ gas at a temperature of 280 degrees C. or higher and a pressure of 10 Torr or higher, and the etching rates of the films tended to increase as the temperature increased and the pressure increased. In addition, as shown in FIG. 21, it was confirmed that it is possible to etch the Mo film when the ratio of the $WF_6$ gas is in the range of 20 to 90% ($WF_6:O_2$=20:80 to 90:10) (in data of FIG. 21, only 30 to 90%).

Subsequently, a sample including a $SiO_2$ film on a bare wafer, a sample including an amorphous Si (a-Si) film on a bare wafer, a sample including an $Al_2O_3$ film on a bare wafer, and a sample including a TiN film on a bare wafer were also etched under the same conditions. As each film, a film formed through CVD was used. Then, etching selectivity were obtained from the etching rates of these films and the etching rates of the ALD-Mo films and the PVD-Mo films.

As a result, regarding the ALD-Mo films, the selectivity relative to the $SiO_2$ film was 459, the selectivity relative to the a-Si film was 5,189, the selectivity relative to the $Al_2O_3$ film was 1,429, and the selectivity relative to the TiN film was 78. Regarding the PVD-Mo films, the selectivity relative to the $SiO_2$ film was 494, the selectivity relative to the a-Si film was 5,560, the selectivity relative to the $Al_2O_3$ film was 1,536, and the selectivity relative to the TiN film was 83. As described above, it was confirmed that all the Mo films have a high selectivity of 450 or more relative to Si-containing films such as a $SiO_2$ film and an a-Si film. It was also confirmed that a high selectivity is obtained relative to other films.

Experimental Example 2

Here, a sample having a Mo film (ALD-Mo film) formed through ALD on a bare wafer and a sample having a Mo film (PVD-Mo film) formed through PVD on a bare wafer were prepared and etched. The etching was performed by using an $O_2$ gas as the oxidation gas and a $MoF_6$ gas as the hexafluoride gas through the above-described sequence 1 (simultaneous supplying the $O_2$ gas and the $MoF_6$ gas). In addition to the $O_2$ gas and the $MoF_6$ gas, the $N_2$ gas was supplied as a diluting gas. At that time, the temperature of the stage was changed from 50 to 400 degrees C., the pressure was changed from 5 to 100 Torr, and the ratio of the $MoF_6$ gas to the $O_2$ gas+$MoF_6$ gas was changed from 10 to 99% ($MoF_6:O_2$=10:90 to 99.9:0.1), the etching time was set to 120 sec, and the etching amount under each condition was obtained. As a result, the etching amounts of the ALD-Mo film and the PVD-Mo film both exceeded 50 nm.

Subsequently, etching was also performed on a sample including a Poly-Si film formed through CVD on a bare wafer, a sample including a SiN film formed through CVD on a bare wafer, and a sample including a thermal oxide film (a $SiO_2$ film) under the same conditions. As a result, when the temperature was 200 degrees C., the etching amounts of these films were less than 1 nm.

From the foregoing, it was confirmed that even when the Mo film is etched by using the $MoF_6$ gas as the hexafluoride gas, a high etching selectivity of more than 50 is obtained relative to a Si-containing film.

Experimental Example 3

Here, a wafer sample in which a $SiO_2$ film having a concave pattern was formed on a Si substrate and a W film was formed via a TiN film on the $SiO_2$ film as a barrier film was prepared and etched. The $SiO_2$ film and the TiN film were formed through CVD. The etching was performed by using an $O_2$ gas as the oxidation gas and a $WF_6$ gas as the hexafluoride gas through the above-described sequence 1 (simultaneously supplying the $O_2$ gas and the $WF_6$ gas). In addition to the $O_2$ gas and the $WF_6$ gas, the $N_2$ gas was supplied as a diluting gas. The conditions were set as follows: the temperature of the stage: 200 to 400 degrees C., the pressure: 1.5 to 15 Torr, and the ratio of the $WF_6$ gas to the $O_2$ gas+$WF_6$ gas: 50 to 70% ($WF_6$:$O_2$=50:50 to 70:30).

As a result, the etching rate was 6 to 35 nm/min, and tended to increase as the pressure increased. The etching selectivity of the W film relative to the $SiO_2$ film was 350, and the etching selectivity of the W film relative to the TiN film was 103.

Experimental Example 4

Here, in the substrate having the structure of FIG. 11, the recess depth in the laminated portion 210 and the ratio of vacancy on the etched surface when the Mo film 202 was etched through CVE were obtained. Specifically, the ratios of vacancy on the etched surface were obtained for Case A and Case B in each of which, for the inner wall portion of the slit 220 of the Mo film, the first stage etching was performed under the first conditions, and for the portions of the laminated portion 210, the second stage etching (recessing) was performed under different second conditions, respectively. For comparison, an experiment was also performed on Case C, in which etching was performed only under the first conditions. As the oxidation gas, an $O_2$ gas was used, and as the etching gas, a $WF_6$ gas was used. In addition, a $N_2$ gas was used as the carrier gas. All of the temperatures of the stage at the time of etching were 275 to 300 degrees C., and the first stage etching and the second stage etching were both performed through CVE that simultaneously supplies the above-described gases. The first conditions were set as follows: the pressure: 50 to 200 Torr, the flow rate of the $O_2$ gas: 300 to 500 sccm, and the flow rate of the $WF_6$ gas: 300 to 500 sccm. The second conditions were set as follows: in Case A, the pressure: 10 to 50 Torr, the flow rate of the $O_2$ gas: 550 to 700 sccm, the flow rate of the $WF_6$ gas: 100 to 250 sccm, and in Case B, the pressure: 10 to 50 Torr, the flow rate of the $O_2$ gas: 700 to 1,000 sccm, and the flow rate of the $WF_6$ gas: 50 to 100 sccm.

Figure 22:
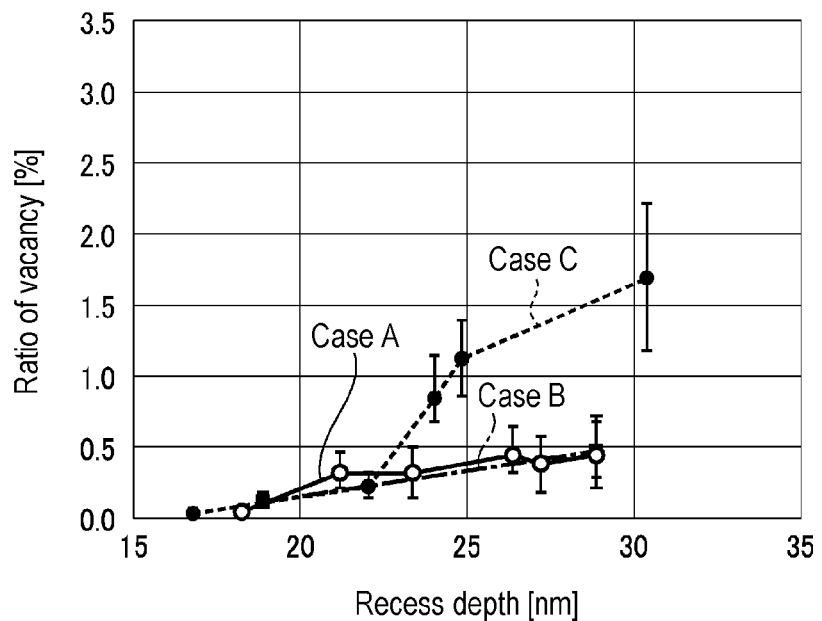
FIG. 22 is a view illustrating a relationship between a recess depth and a ratio of vacancy on an etching surface in Experimental Example 4.

The results are shown in FIG. 22. FIG. 22 is a view showing a relationship between a recess depth (a depth from the slit surface) represented on the horizontal axis and a vacancy ratio (area ratio) of seams and pits represented on the etched surface on the vertical axis. The vacancy ratio on the vertical axis is a ratio of the total area of a plurality of existing seams and pits to the area of the etched surface. As shown in this drawing, in Case C in which etching was performed only under the first conditions, the proportion of vacancy increased from the point where the recess depth exceeds 22 nm, whereas in Case A and Case B, in which the second etching was performed under the condition in which oxidation is dominant, the vacancy ratio hardly increased up to a recess depth of 30 nm.

Experimental Example 5

Here, in the substrate having the structure of FIG. 11, the recess depth in the laminated portion 210 and the percentage of voids of the etched surface when the Mo film 202 was etched through CVE and ALE were obtained. Specifically, experiments were performed for Case D and Case E in each of which, for the inner wall portion of the slit 220 of the Mo film, the first stage etching was performed through CVE under the first conditions, and for the portions of the laminated portion 210, the second stage etching (recessing) was performed through ALE under different second conditions, respectively. As the oxidation gas, an $O_2$ gas was used, and as the etching gas, a $WF_6$ gas was used. In addition, a $N_2$ gas was used as the carrier gas. All the temperatures of the stage during etching were set to 275 to 300 degrees C. The conditions of the first-stage etching were set as follows: the pressure: 70 to 200 Torr, the flow rate of the $O_2$ gas: 300 to 500 sccm, and the flow rate of the $WF_6$ gas: 300 to 500 sccm. The conditions of the second stage etching were set as follows: in Case D, in the oxidation step, the pressure: 70 to 200 Torr, the flow rate of the $O_2$ gas: 400 to 800 sccm, and the time: 360 sec, and in the etching step, the pressure: 10 to 70 Torr, the flow rate of the $WF_6$ gas: 300 to 600 sccm, and the time: 15 sec. In Case E, the same conditions as in Case D were set except that the etching stage time was set to 30 sec.

Figure 23:
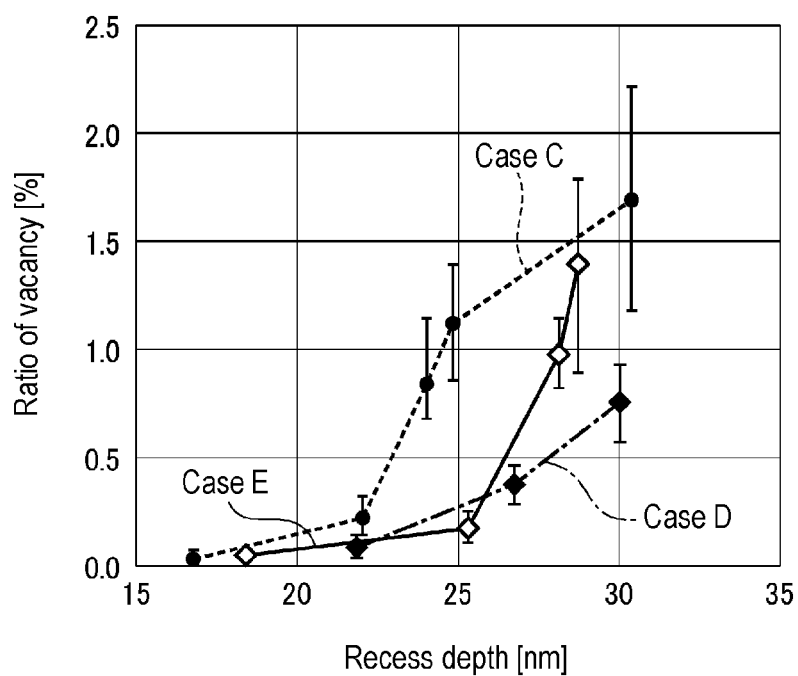
FIG. 23 is a view illustrating a relationship between a recess depth and a ratio of vacancy on an etching surface in Experimental Example 5.

The results are shown in FIG. 23. FIG. 23 is a view showing a relationship between a recess depth (a depth from the slit surface) represented on the horizontal axis and a vacancy ratio (area ratio) of seams and pits represented on the etched surface on the vertical axis. FIG. 23 also shows the results of Case C in which etching was performed through CVE under the first conditions for comparison. As shown in this drawing, in Case C in which only the etching was performed under the first conditions, the vacancy ratio increases from the point at which the recess depth exceeds 22 nm, whereas in Case D in which the second stage etching was performed through ALE under the condition in which the oxidation was dominant, the increase in the vacancy ratio was small when the recess depth was up to 30 nm. Furthermore, in Case E in which, for the second etching stage, the etching stage time was set to be longer than that in Case D, the vacancy ratio tended to increase sharply when the recess depth exceeded 25 nm.

<Other Applications>

Although embodiments have been described above, it should be considered that the embodiments disclosed herein are exemplary in all respect and are not restrictive. The above embodiments may be omitted, replaced, or modified in various forms without departing from the scope and gist of the appended claims.

For example, the examples of structures of the substrates illustrated in FIGS. 2, 3, and 11 are merely examples, and any structure may be applied as long as it includes a Si-containing material and a Mo film or a W film, which is exposed. In addition, the configuration of the etching apparatus is merely an example, and is not particularly limited as long as the etching is performed with a gas without using plasma.

Although the MoF$_6$ gas, the WF$_6$ gas, and the SF$_6$ gas have been exemplified as the hexafluoride gas, other hexafluoride gases such as a SeF$_6$ gas and a ReF$_6$ gas may be used.

The case in which a semiconductor wafer is used as the substrate has been described, but the substrate is not limited to the semiconductor wafer. A flat panel display (FPD) substrate represented by a substrate for a liquid crystal display (LCD) or other substrates such as a ceramic substrate may be used.

EXPLANATION OF REFERENCE NUMERALS

1: etching apparatus, 12: stage, 13: gas supply mechanism, 14: exhaust mechanism, 15: controller, 35: temperature controller, 101, 201: SiO$_2$ film, 102: recess pattern, 103: Al$_2$O$_3$ film, 104, 202: Mo film, 105: TiN film, 106: W film 210: laminated portion, 220: groove (slit), 221: seam, 222: pit, 223: oxide film, 300: structure, S: substrate

What is claimed is:

1. An etching method comprising:
   providing, within a chamber, a substrate that includes at least a silicon-containing material and a molybdenum film or a tungsten film which is in an exposed state; and
   selectively etching the molybdenum film or the tungsten film relative to the silicon-containing material by supplying, into the chamber, an oxidation gas and a hexafluoride gas as an etching gas,
   wherein, in the selectively etching the molybdenum film or the tungsten film relative to the silicon-containing material, the molybdenum film or the tungsten film is etched under a condition in which oxidation becomes dominant, and expansion of vacancy on an etched surface is suppressed.

2. The etching method of claim 1, wherein the hexafluoride gas is at least one selected from a MoF$_6$ gas, a WF$_6$ gas, and a SF$_6$ gas.

3. The etching method of claim 1, wherein the oxidation gas is selected from an O$_2$ gas, an O$_3$ gas, a NO gas, and a N$_2$O gas.

4. The etching method of claim 1, wherein an etching selectivity of the molybdenum film or the tungsten film relative to the silicon-containing material is 50 or more.

5. The etching method of claim 4, wherein the substrate further includes at least one of an Al$_2$O$_3$ film and a TiN film as a barrier film under the molybdenum film or the tungsten film, and an etching selectivity of the molybdenum film or the tungsten film relative to the Al$_2$O$_3$ film and the TiN film is 50 or more.

6. The etching method of claim 1, wherein an etching selectivity of the molybdenum film or the tungsten film relative to the silicon-containing material is 450 or more.

7. The etching method of claim 1, wherein the silicon-containing material is at least one of a Si film, a SiO$_2$ film, and a SiN film.

8. The etching method of claim 1, wherein an internal pressure of the chamber in the selectively etching the molybdenum film or the tungsten film relative to the silicon-containing material ranges from 133.3 to 93,326 Pa.

9. The etching method of claim 1, wherein a temperature of the substrate in the selectively etching the molybdenum film or the tungsten film relative to the silicon-containing material ranges from 50 to 500 degrees C.

10. The etching method of claim 9, wherein, when the hexafluoride gas is a MoF$_6$ gas, the temperature of the substrate in the selectively etching the molybdenum film or the tungsten film relative to the silicon-containing material is 50 to 300 degrees C.

11. The etching method of claim 9, wherein, when the hexafluoride gas is a WF$_6$ gas, the temperature of the substrate in the selectively etching the molybdenum film or the tungsten film relative to the silicon-containing material is 200 to 500 degrees C.

12. The etching method of claim 1, wherein, in the selectively etching the molybdenum film or the tungsten film relative to the silicon-containing material, the oxidation gas and the hexafluoride gas are supplied simultaneously, and a flow rate ratio of the oxidation gas to the hexafluoride gas is adjusted to make the oxidation dominant.

13. The etching method of claim 1, wherein, in the selectively etching the molybdenum film or the tungsten film relative to the silicon-containing material, the oxidation gas and the hexafluoride gas are sequentially supplied, and a ratio of a time for supplying the oxidation gas to a time for supplying the hexafluoride gas is adjusted to make the oxidation dominant.

14. The etching method of claim 1, wherein the selectively etching the molybdenum film or the tungsten film relative to the silicon-containing material includes simultaneously supplying the oxidation gas and the hexafluoride gas.

15. The etching method of claim 14, wherein, in the selectively etching the molybdenum film or the tungsten film relative to the silicon-containing material, a ratio of the hexafluoride gas to the oxidation gas when the oxidation gas and the hexafluoride gas are simultaneously supplied ranges from 10:90 to 99.9:0.1.

16. The etching method of claim 1, wherein the selectively etching the molybdenum film or the tungsten film relative to the silicon-containing material further includes supplying the oxidation gas prior to the simultaneously supplying the oxidation gas and the hexafluoride gas.

17. The etching method of claim 1, wherein the selectively etching the molybdenum film or the tungsten film relative to the silicon-containing material includes supplying the oxidation gas first, and subsequently stopping the supplying the oxidation gas and supplying the hexafluoride gas.

18. The etching method of claim 17, wherein, in the selectively etching the molybdenum film or the tungsten film relative to the silicon-containing material, the supplying the oxidation gas and the supplying the hexafluoride gas are alternately repeated multiple times.

19. The etching method of claim 17, further comprising:
   evacuating an interior of the chamber after the supplying the hexafluoride gas.

20. The etching method of claim 17, further comprising:
   evacuating an interior of the chamber between the supplying the oxidation gas and the supplying the hexafluoride gas.

21. An etching method comprising:
   providing, within a chamber, a substrate that includes at least a silicon-containing material and a molybdenum film or a tungsten film which is in an exposed state; and
   selectively etching the molybdenum film or the tungsten film relative to the silicon-containing material by supplying, into the chamber, an oxidation gas and a hexafluoride gas as an etching gas,
   wherein the selectively etching the molybdenum film or the tungsten film relative to the silicon-containing material includes: a first stage of supplying, into the chamber, the oxidation gas and the hexafluoride gas as the etching gas to etch the molybdenum film or the tungsten film, and a second stage of supplying the hexafluoride gas as the etching gas and switching to a condition in which oxidation becomes dominant to etch the molybdenum film or the tungsten film.

22. The etching method of claim 21, wherein, in the second stage, the oxidation gas and the hexafluoride gas are supplied simultaneously, and a flow rate ratio of the oxidation gas to the hexafluoride gas is adjusted to make the oxidation dominant.

23. The etching method of claim 21, wherein, in the second stage, the oxidation gas and the hexafluoride gas are sequentially supplied, and a ratio of a time for supplying the oxidation gas to a time for supplying the hexafluoride gas is adjusted to make the oxidation dominant.

* * * * *